United States Patent [19]
Sugibayashi

[11] Patent Number: 6,084,806
[45] Date of Patent: Jul. 4, 2000

[54] SEMICONDUCTOR MEMORY DEVICE

[75] Inventor: Tadahiko Sugibayashi, Tokyo, Japan

[73] Assignee: NEC Corporation, Tokyo, Japan

[21] Appl. No.: 09/256,135

[22] Filed: Feb. 24, 1999

[30] Foreign Application Priority Data

Feb. 25, 1998 [JP] Japan .................................. 10-043277

[51] Int. Cl.[7] .................................................. G11C 7/00
[52] U.S. Cl. ...................... 365/200; 365/230.06; 365/194
[58] Field of Search .............................. 365/200, 230.06, 365/194, 195, 233.5

[56] References Cited

U.S. PATENT DOCUMENTS 5,825,699  10/1998  Tanaka ..................................... 365/200
5,841,711  11/1998  Watanabe ................................ 365/200

*Primary Examiner*—Vu A. Le
*Attorney, Agent, or Firm*—Darryl G. Walker

[57] ABSTRACT

A semiconductor memory device (100) includes a normal cell array and a redundant cell array. When a normal cell array location is to be replaced by selecting the redundant cell array, a first circuit (120) outputs a one-shot signal (PBLST) to a redundant block selection circuit (118). The redundant block selection circuit (118) activates a redundant precharge stop signal (RDPBL) without waiting for a redundant cell decoder (110) decoding result. The redundant cell decoder (110) result indicates whether the redundant cell array is selected or not selected. Accelerated accesses to the redundant cell array can result, improving overall access speed for the semiconductor memory device (100).

20 Claims, 6 Drawing Sheets

SEMICONDUCTOR MEMORY DEVICE

TECHNICAL FIELD

The present invention relates generally to semiconductor memory devices, and more particularly to semiconductor memory devices having redundant cell arrays.

BACKGROUND OF THE INVENTION

Semiconductor memory devices can often include precharge circuits. Precharge circuits can serve to precharge and/or equalize conductive lines to a particular potential. Referring now to FIG. 5, a substantial portion of a precharge circuit for a semiconductor memory device is set forth in a block diagram. The precharge circuit is designated by the general reference character 500, and is shown to include sense amplifiers (SA1 and SA2). The sense amplifiers are shown to include p-channel transistors, P500 and P502, and n-channel transistors, N500 and N502. Also included in FIG. 5 are n-channel transistors N504, N506 and N508, redundant memory cells 502, and capacitors C500 and C502. Bit lines are shown as BL1, /BL1, BL2 and /BL2, and a word line is shown as WL. Furthermore, driving signals for the sense amplifiers (SA1 and SA2) are shown as SAP and SAN, and RDPBL indicates a precharge stop signal for stopping the precharge of redundant memory cells 502.

It is understood that while FIG. 5 illustrates the precharge circuit for redundant memory cells 502, the precharge circuit for a "normal" (non-redundant) memory cell would have the same structure.

FIG. 4 is a block diagram showing the structure of a selection circuit. The selection circuit selects a precharge output signal, and outputs the signal to the precharge circuit set forth in FIG. 5. The selection circuit is designated by the general reference character 400.

In the circuit of FIG. 4, an address signal Ai is applied to an address buffer 402. In addition an array selection signal CE and a clock signal CLK is applied to an NAND gate 404. The output of NAND gate 404 is an address decision signal ADLST. The ADLST signal is also applied to the address buffer 402. In response to the Ai and ADLST signals, the address buffer 402 outputs an address XAD to a cell array.

In the arrangement of FIG. 4, the address XAD is output to a block selection circuit 406 by way of a buffer 408. The block selection circuit 406 outputs a precharge stop signal PBL to a normal memory cell array (not shown). The address XAD is also sent to a number of X-decoders 410-1 to 410-n by way of another buffer 412. When address XAD corresponds to a normal memory cell array, one of the X-decoders (410-1 to 410-n) will activate a normal word line (WL1 to WLn). The normal word line (WL1 to WLn) will be activated in conjunction with the PBL signal. Moreover, following the activation of a word line (WL1 to WLn) and a precharge signal PBL, a bit line can be selected, and a normal cell accessed for a data read operation or the like.

When address XAD corresponds to a redundant memory cell array, address XAD is decoded by a redundancy decoder 414. Redundancy decoder 414 includes a number of redundant decoders, shown as 416-1 to 416-n. The outputs from redundant decoders (416-1 to 416-n) are applied as inputs to an OR gate 418. The output of OR gate 418 is a redundant cell decode signal RDSEL. The RDSEL signal is applied to block selection circuit 406 and will place the block selection circuit 406 in an output inhibited state. In an output inhibited state, the PBL signal is deactivated. The RDSEL signal will enable a block selection circuit 420, which will output a redundant precharge stop signal RDPBL. The RDPBL signal will be applied to a redundant memory cell array (not shown).

As shown in FIG. 4, the output of each redundant decoder (416-1 to 416-n) is applied to a corresponding redundant X-decoder (422-1 to 422-n). One of the redundant X-decoders (422-1 to 422-n) can then activate a redundant word line (RDWL1 to RDWLn) in accordance with the input of the RDPBL signal. Once a redundant word line (RDWL1 to RDWLn) is activated, a bit line can be selected, and a redundant cell accessed for a data read operation or the like.

Referring now to FIG. 6, a timing diagram is set forth illustrating the operation of the circuits set forth in FIGS. 4 and 5. Set forth in FIG. 6 are address XAD, redundant cell decode signal RDSEL, redundant precharge stop signal RDPBL, a redundant word line RDWL, drive signals SAN and SAP, and a bit line pair BL and /BL. The operation of a conventional semiconductor memory device will be described by referring to the timing diagram of FIG. 6 in conjunction with FIGS. 4 and 5.

An Ai signal is received by address buffer 402. In addition, in response to clock signal CLK and array selection circuit CE, NAND gate 404 outputs an ADLST signal to address buffer 402. A read cycle is thereby started, and an address XAD is output from address buffer 402 as an applied address. This is represented in FIG. 6 by waveform XAD making a transition. The address XAD is input to redundant decoder 414. When address XAD corresponds to the address of a redundant memory cell, it is detected by one of the redundant decoders (416-1 to 416-n), and by operation of OR gate 418, the RDSEL signal is activated. In the particular arrangement of FIGS. 4–6, the RDSEL signal is active when it is at a logic high level. The RDSEL signal is applied to block selection circuits 406 and 420.

In response to an active RDSEL signal, the output of block selection circuit 406 is inhibited. Simultaneously, the active RDSEL signal enables block selection circuit 420. The activated block selection circuit 420 activates the RDPBL. In the particular arrangement of FIGS. 4–6, the RDPBL signal stops a precharge operation (is active) when low. Thus, for the particular precharge circuit set forth in FIG. 5, when the RDPBL signal goes low, transistors N504 to N508 will be turned off. One result is that bit line BL1 is isolated from bit line /BL1 and bit line BL2 is isolated from bit line /BL2.

Referring again to FIG. 5, once the PBL signal is driven low, and transistors N504 to N508 are turned off, the signal VPL is set to a logic low level and redundant word line RDWL is selected. The redundant word line RDWL of FIG. 5 may be selected by a redundant X-decoder, such as those identified as 422-0 to 422-n in FIG. 4. In such a case the redundant word line RDWL will be driven to a logic high level, as shown in FIG. 6. Following the activation of a redundant word line RDWL, drive signal SAP is driven to a logic high level, and drive signal SAN is driven to a logic low level. This is represented by the SAN, SAP waveform in FIG. 6. With the SAP signal driven high and the SAN signal driven low, a sense amplifier (SA1 and SA2, for example) will be turned on. Consequently, a bit line pair will be driven to complementary logic levels. In the particular example of FIG. 6, such an operation is illustrated by the BL, /BL waveform, in which a bit line BL is driven to a logic high level, and a bit line /BL is driven to a logic low level. In this way, data can be read from a redundant memory cell (such as 502).

A problem present in some conventional redundant decoders, such as that set forth in FIG. 4, is the complexity of the circuits, and the delay involved in selecting a redundant memory cell. Selecting a redundant memory cell requires the simultaneous decoding of a redundant memory cell array selection address (to generate a redundant cell decode signal RDSEL), and the decoding of a redundant word line selection address (to activate a redundant word line). Further, in the generation of the redundant cell decode signal RDSEL, it is necessary to compute the logical sum of each output of the redundancy decoders 416-1 to 416-n. Thus, the selection of a redundant memory cell can take longer than the selection of a normal memory cell.

In light of the delay involved in conventional approaches to selecting redundant memory cells, it would be desirable to improve the overall speed of a memory device by accelerating the access to redundant memory cells.

SUMMARY OF THE INVENTION

According to the disclosed embodiments, a semiconductor memory device can include a normal cell array and a redundant cell array. When a normal cell array location is to be replaced by a redundant cell array location, the redundant cell array receives a redundant precharge stop signal. The redundant precharge stop signal does not have to wait for a determination of whether the redundant cell array is selected or not selected.

According to one aspect of the disclosed embodiments, a semiconductor memory device can include a cell array having a normal cell array and a redundant cell array. A first selection circuit selects the normal cell array and a second selection circuit selects the redundant cell array. The semiconductor memory device can further include a signal output circuit that outputs a signal to the second selection circuit when the cell array is selected. The output signal makes the second selection circuit output a redundant precharge stop signal to the redundant cell array and select the redundant cell array.

According to another aspect of the disclosed embodiments, a semiconductor memory device includes a cell array with a normal cell array and a redundant cell array. A second selection circuit selects the redundant cell array when the cell array is accessed. A semiconductor memory device can further include a decoder that determines when the redundant cell array is selected or not selected. When the decoder indicates that the redundant cell array is not selected, the second selection circuit de-selects the redundant cell array.

An advantage of the disclosed embodiments is that a semiconductor memory device can include a normal cell array and a redundant cell array. When a normal cell array location is to be replaced by a redundant cell location, a precharge stop signal for the redundant cell array is generated without waiting for a determination of whether the redundant cell array is selected or not selected. This can allow for faster access speeds for the entire memory device.

DETAILED DESCRIPTION OF THE EMBODIMENTS

Figure 1:
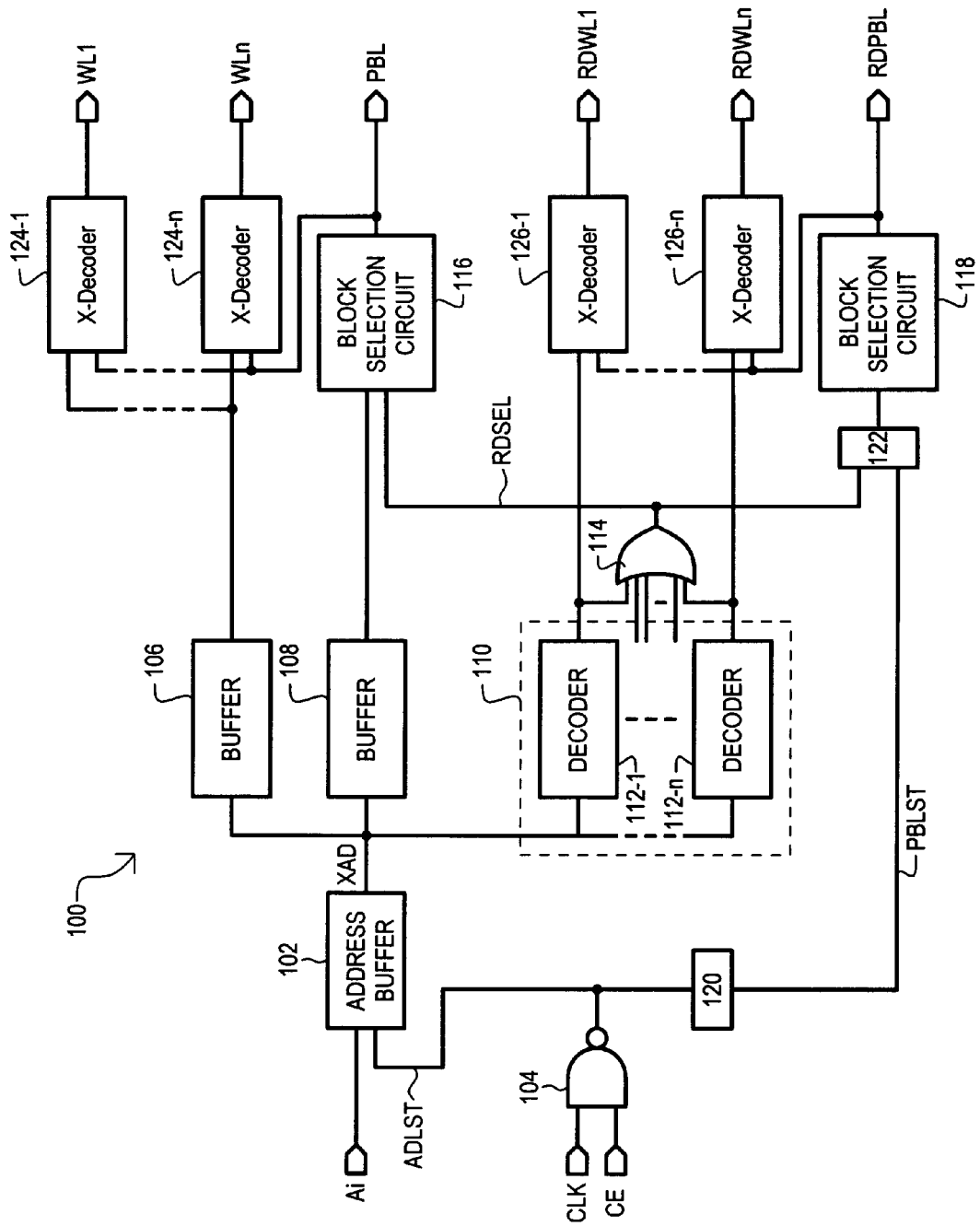
FIG. 1 is block diagram of one embodiment.
Figure 9:
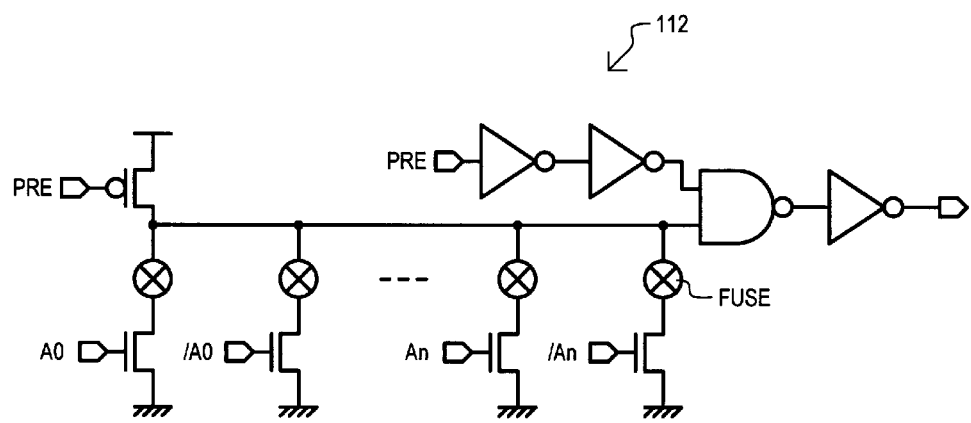
FIG. 9 is a circuit diagram of a redundant decoder 112.

Various embodiments of the present invention will now be described by referring to a number of figures. FIG. 1 is a block diagram illustrating a portion of a semiconductor memory device according to one embodiment. The portion is designated by the general reference character 100, and includes a selection circuit that outputs a precharge stop signal for a cell array. FIG. 1 is shown to include an address buffer 102, an NAND gate 104, a buffer 106, a buffer 108, and a redundant cell decoder 110. Redundant cell decoder 110 includes a number of redundant decoders 112-1 to 112-n. The redundant decoders (112-1 to 112-n) determine whether an address XAD output from address buffer 102 is an address for selecting a redundant memory cell. In response to such an address, a redundant decode signal RDSEL will be generated. A circuit diagram of each redundant decoder 112-1 to 112-n is shown in FIG. 9. As shown in FIG. 9, each of the redundant decoders 112-1 to 112-n is precharged in response to a precharge signal Pre and discharged in response to a different address XAD (A0-An) form an address to be replaced. Each redundant decoder 112-1 to 112-n is programmed by fuses so as to be prevented from discharging when the address to be replaced is supplied. Thus, each redundant decoder 112-1 to 112-n activates its output signal when the programmed address which is the address to be replaced is supplied after the precharging. A redundant memory cell may be a cell like those shown as items 502 in FIG. 5.

Also set forth in FIG. 1 is an OR gate 114, a "normal" block selection circuit 116, and a "redundant" block selection circuit 118. The normal block selection circuit 116 outputs a precharge stop signal PBL to normal cells. The PBL signal can result in the disconnection of a bit line BL from a corresponding complementary bit line /BL in a normal memory cell array. The redundant block selection circuit 118 outputs a redundant precharge stop signal RPBL. The RPBL signal can be applied to redundant memory cells, also resulting in the disconnection of a bit line BL from a corresponding complementary bit line /BL. The RPBL signal can be applied to redundant memory cells in the manner set forth in FIG. 5.

Figure 7:
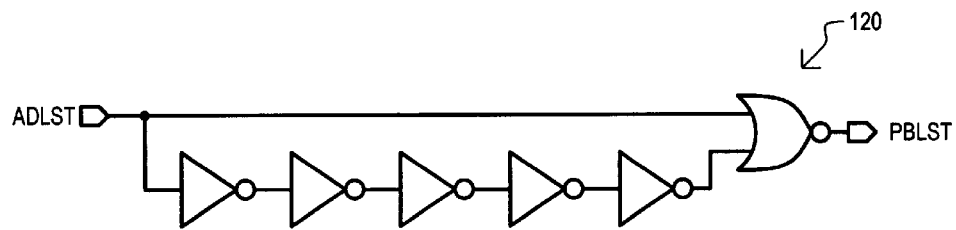
FIG. 7 is a circuit diagram of a first circuit 120.
Figure 8:
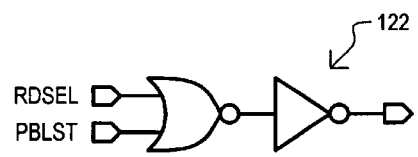
FIG. 8 is a circuit diagram of a second circuit 122.

The NAND gate 104 receives a cell array selection signal CE and a clock signal CLK. In response to the CE and CLK signals, NAND gate 104 an address decision signal ADLST. A first circuit 120 receives the ADLST signal and generates a one-shot signal PBLST. A circuit diagram of the first circuit 120 is shown in FIG. 7. The PBLST signal will result in the generation of a precharge stop signal for redundant memory cells. Redundant memory cells can have the configuration set forth in FIG. 5. The PBLST signal is received by a second circuit 122. A circuit diagram of the second circuit 122 is shown in FIG. 8. The second circuit 122 causes redundant block selection circuit 118 to generate a redundant precharge stop signal RDPBL in response to either the one-shot PBLST signal or RDSEL signal. The RDSEL signal is generated by one of the redundant decoders (112-1 to 112-n), which is passed through the OR gate 114.

Also shown in FIG. 1 are normal X-decoders 124-1 to 124-n and redundant X-decoders 126-1 to 126-n. Normal X-decoders (124-1 to 124-n) are decoders for activating normal word lines WL1 to WLn. Redundant X-decoders (126-1 to 126-n) are decoders for activating redundant word lines RDWL1 to RDWLn. Address XAD is applied to normal X-decoders (124-1 to 124-n) by way of buffer 106, and applied to normal block selection circuit 114 by way of buffer 108.

Having described a general configuration for the embodiment set forth in FIG. 1, the operation of the embodiment 100 will now be described. When an address Ai is input to address buffer 102, it can include information for selecting a normal cell array. Address Ai will result in address XAD being applied to normal block selection circuit 116 by buffer 108. If the address does not correspond to a redundant memory cell location, normal block selection circuit 116 will provide precharge stop signal PBL. The PBL signal can be applied to a normal memory cell array (not shown). Address XAD is also applied to normal X-decoders (124-1 to 124-n). When address XAD corresponds to the address of a normal memory cell array, one normal X-decoder (124-1 to 124-n) will activate a corresponding normal word line (WL1 to WLn) in response to the PBL signal. The selection of a bit line will result in data being read from a normal memory cell.

In contrast, the address XAD can correspond to a redundant memory cell array. In such a case, when address XAD is received by redundant cell decoder 110, one of the redundant decoders (112-1 to 112-n) will provide an active output. The active output will be applied through OR gate 114, generating a RDSEL signal. The PBL signal provided by normal block selection circuit 116 will be deactivated by the RDSEL signal. In addition, if a normal word line (WL1 to WLn) is activated, the PBL signal will deactivate the normal word line. Moreover, at the same time, redundant block selection circuit 118 is enabled, and redundant precharge stop signal RDPBL is output to a redundant cell array (not shown).

In the arrangement of FIG. 1, the PBLST signal is generated by the first circuit 120 and supplied to the redundant block selection circuit 118 before the RDSEL signal activates the PBL signal. That is, the first circuit 120 receives the ADLST signal output from NAND gate 104, whether or not address XAD corresponds to a redundant memory cell array. The first circuit 120 then outputs the one-shot signal PBLST to second circuit 122. Then, upon receiving the PBLST signal, the second circuit 122 supplies the PBLST signal to the redundant block selection circuit 118, which drives the RDPBL signal low. Consequently, redundant block selection circuit 118 can receive the one-shot PBLST signal before redundant decode signal RDSEL, and result in the output of the RDPBL signal to a redundant cell array.

In addition, when address XAD corresponds to a redundant location, one redundant X-decoder (126-1 to 126-n). The redundant X-decoder (126-1 to 126-n) will activate a corresponding redundant word line (RDWL1 to RDWLn) in response to the RDPBL signal. The RDPBL signal, it will be recalled, is provided by the redundant block selection circuit 118 in response to the one-shot PBLST signal. Once a redundant word line (RDWL1 to RDWLn) has been activated, a bit line can be selected, and a redundant memory cell can be accessed for a data read or the like.

Thus, in the arrangement of FIG. 1, a one-shot signal PBLST for forcibly stopping the precharge operation of a redundant memory cell array is generated by first circuit 120. Redundant block selection circuit 118 generates a precharge stop signal RDPBL upon receiving the one-shot signal PBLST. One redundant X-decoder (126-1 and 126-n), selected by redundant decoders (112-1 and 112-n) in redundant cell decoder 110, outputs an activation signal to a redundant word line (RDWL1 to RDWLn). The activation signal is generated in response to the RDPBL signal, which is generated from the one-shot PBLST signal. Therefore, high-speed access to a redundant memory cell can be obtained without having to wait for a decoding operation by a redundant decoder.

The operations of an embodiment set forth in FIGS. 1 and 5, will now be described in conjunction with timing diagrams set forth in FIGS. 2 and 3.

A normal memory cell array selecting operation will first be described in conjunction with FIGS. 1, 2 and 5.

Figure 2:
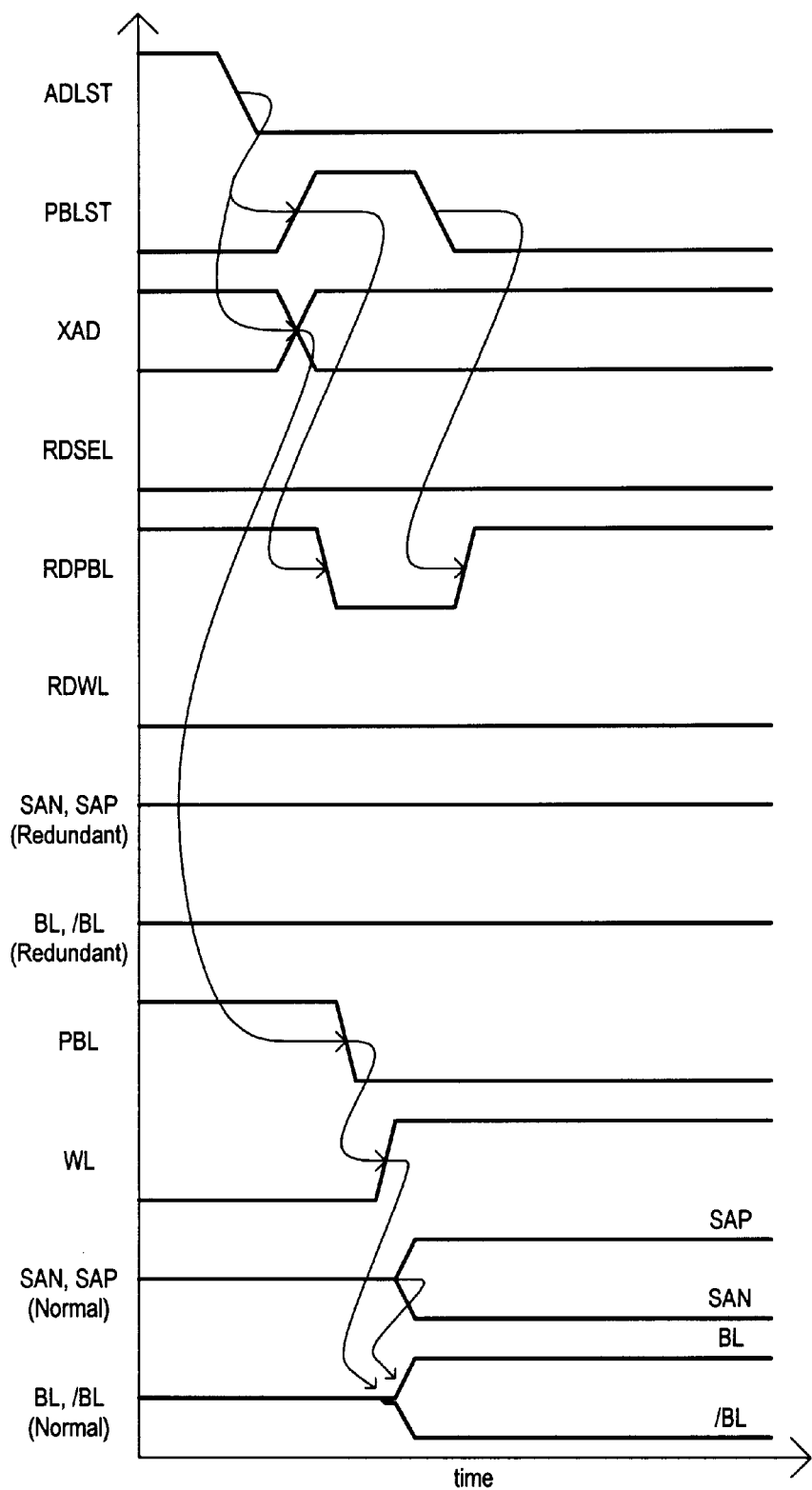
FIG. 2 is a timing diagram illustrating a normal access according an embodiment.

Referring now to FIGS. 1 and 2, an address decision signal ADLST is output from NAND gate 104 in response to the array selection CE signal and clock CLK signal. This is shown by the waveform ADLST transitioning from high to low. The ADLST signal results in the first circuit 120 outputting a high-going one-shot signal PBLST. The PBLST signal is applied to the second circuit 122 and results in the forcible stopping of a precharging operation for a redundant memory cell array. This is shown by the high-going PBLST waveform pulse. In addition, address buffer 102 generates an address XAD in accordance with input address signal Ai and the ADLST signal from NAND gate 104. The address XAD is output to buffers (106 and 108) and to redundant cell decoder 110. This is represented by the transition in the value of the XAD waveform.

The above-described one-shot PBLST signal is output to redundant block selection circuit 118 by second circuit 122. Consequently, the redundant block selection circuit 118 drives the redundant precharge stop signal RDPBL low for a predetermined amount of time. This is shown by the low-going portion of the RDPBL waveform in FIG. 2. If reference is made to FIG. 5, if the arrangement of FIG. 5 represents a precharge circuit for redundant memory cells, the low RDPBL signal will result in transistors N504–N508 being turned off for a certain period of time. Consequently, bit lines BL1 and BL2 will be disconnected from bit lines /BL1 and /BL2, respectively.

In the normal access illustrated by FIG. 2, address XAD corresponds to the address of a normal memory cell array, and does not correspond to an address for a redundant memory cell array. As a result, redundant cell decoder 110 does not output an active RDSEL signal. This is shown by the RDSEL waveform in FIG. 2, which remains at the logic low level. Because the RDSEL signal remains inactive (low in the particular arrangement of FIG. 2), an activation signal will not be transmitted to redundant word lines (RDWL1 to RDWLn), and the redundant word lines (RDWL1 to RDWLn) will remain at a logic low. This is represented by the RDWL waveform in FIG. 2, which remains at a logic low level. In addition, the drive signals SAP and SAN will remain inactive. This is illustrated by the SAN, SAP (Redundant) waveform in FIG. 2, which is shown to remain at an intermediate level. Because the redundant word lines (RDWL1 to RDWLn) and drive signals (SAP and SAN) are inactive, no signal is driven on the bit lines (BL1, /BL1, BL2, /BL2). This is represented by the waveform BL, /BL (Redundant) in FIG. 2, which remains at an intermediate level.

However, the address XAD that is output from address buffer 102 is supplied to normal block selection circuit 116 by way of buffer 108. In response to the applied address, the block selection circuit 116 drives the precharge stop signal PBL to a logic low level. The low PBL signal will terminate the precharging of the normal memory cells. This is represented by the low-going PBL waveform in FIG. 2. If reference is made to FIG. 5, if the precharge circuit set forth is for a normal memory cell array, the low-going PBL signal will disconnect bit lines BL1 and BL2 from bit lines /BL1 and /BL2, respectively.

In the above-described situation, the address XAD for a normal memory cell is further applied to normal X-decoders (124-1 to 124-n) through buffer 106. An activation signal is then sent to one of the normal word lines (WL1 to WLn) in response to the low-going transition in the PBL signal. This is represented by the WL waveform in FIG. 2. With one of the normal word lines activated, a normal memory cell is accessed. Thereafter, drive signals SAN, SAP are activated, with the SAP signal being driven to a high value and the SAN signal being driven to a low value. This is represented by the SAN, SAP (Normal) waveform of FIG. 2. Referring once again to FIG. 5, if the precharge circuit of FIG. 5 illustrates a normal precharge circuit, the resulting access will result in bit line pairs being driven to complementary logic values according to data stored in the normal memory cells. This is represented by the BL, /BL (Normal) waveform of FIG. 2.

Figure 5:
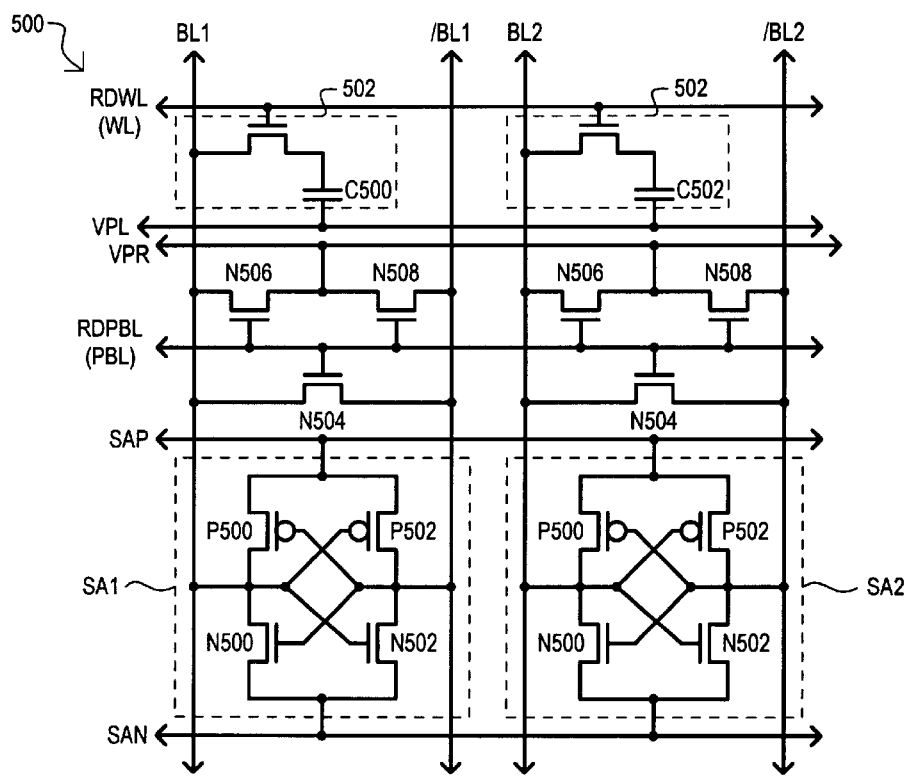
FIG. 5 is a block diagram of a portion of a precharge circuit.
Figure 6:
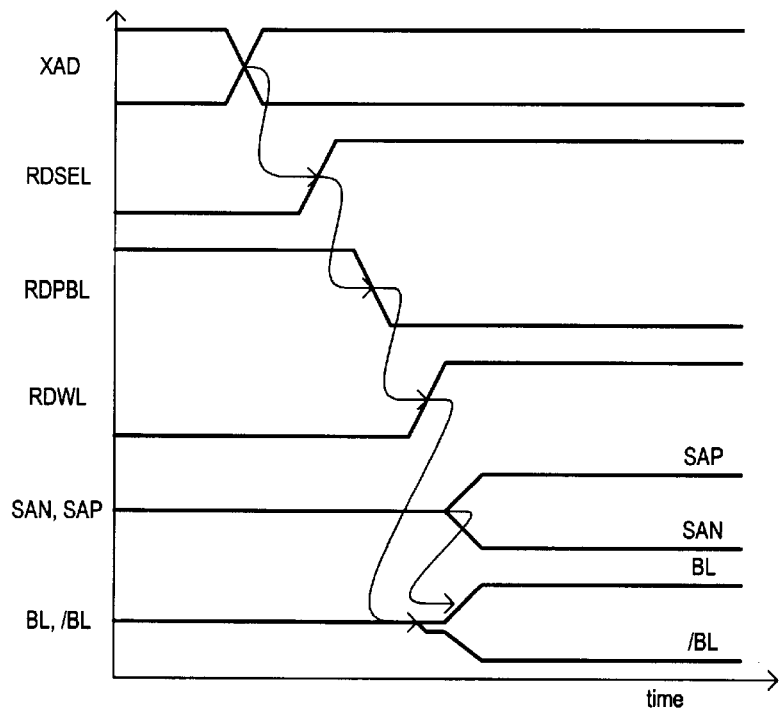
FIG. 6 is a timing diagram illustrating the operation of the circuits set forth in FIGS. 4 and 5.

In the particular access illustrated by FIG. 2, if a precharge arrangement such as that set forth in FIG. 5 represented a normal precharge circuit, the VPL signal would be set to a logic low level, and a normal memory cell would be accessed for a data read operation or the like.

Having described a normal memory cell array selecting operation, a redundant memory cell array selecting operation will now be described in conjunction with FIGS. 1, 3 and 5.

As described above, an address decision signal ADLST is output from NAND gate 104 in response to the array selection CE signal and clock CLK signal. The CLK signal may be a read clock signal generated for a read operation. The response of the ADLST is shown by the waveform ADLST transitioning from high to low in FIG. 3. The transition of the ADLST signal results in the first circuit 120 outputting a high-going one-shot signal PBLST having a predetermined duration. This is illustrated the PBLST waveform pulsing high in FIG. 3. A redundant access also includes address buffer 102 generating an address XAD in accordance with input address signal Ai and the ADLST signal from NAND gate 104. The address XAD is output to buffers (106 and 108) and to redundant cell decoder 110. This is represented by the transition in the value of the XAD waveform in FIG. 3.

The above-described one-shot PBLST signal is output to redundant block selection circuit 118 by second circuit 122. Consequently, the redundant block selection circuit 118 outputs a precharge stop signal RDPBL having a logic low level. Referring now to FIG. 5, if the precharge circuit represents a redundant precharge circuit, the low RDPBL signal will result in transistors N504 to N508 being turned off. This is represented by the RDPBL signal in FIG. 3, which is shown to transition from high to low.

Figure 3:
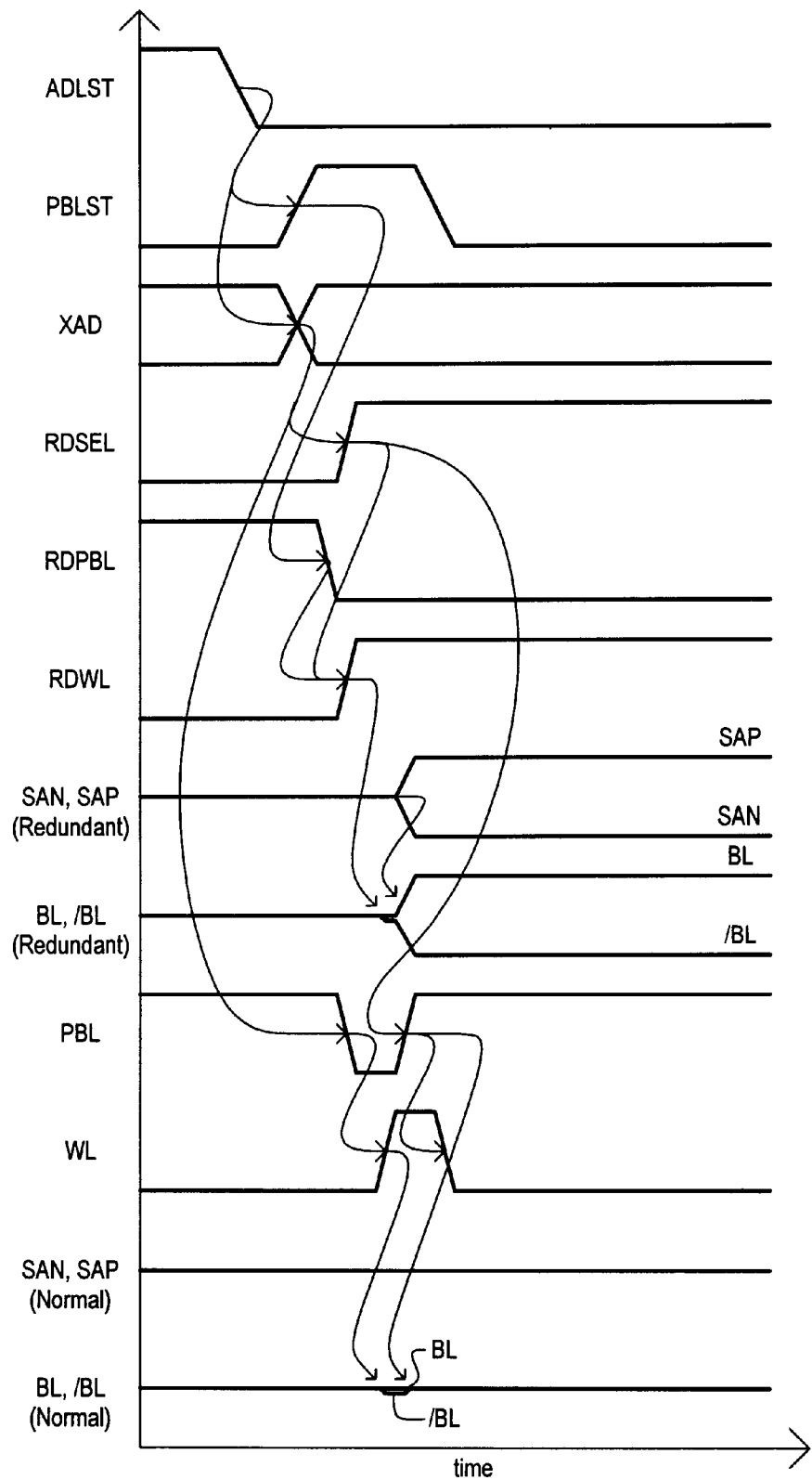
FIG. 3 is a timing diagram illustrating a redundant access according an embodiment.
Figure 4:
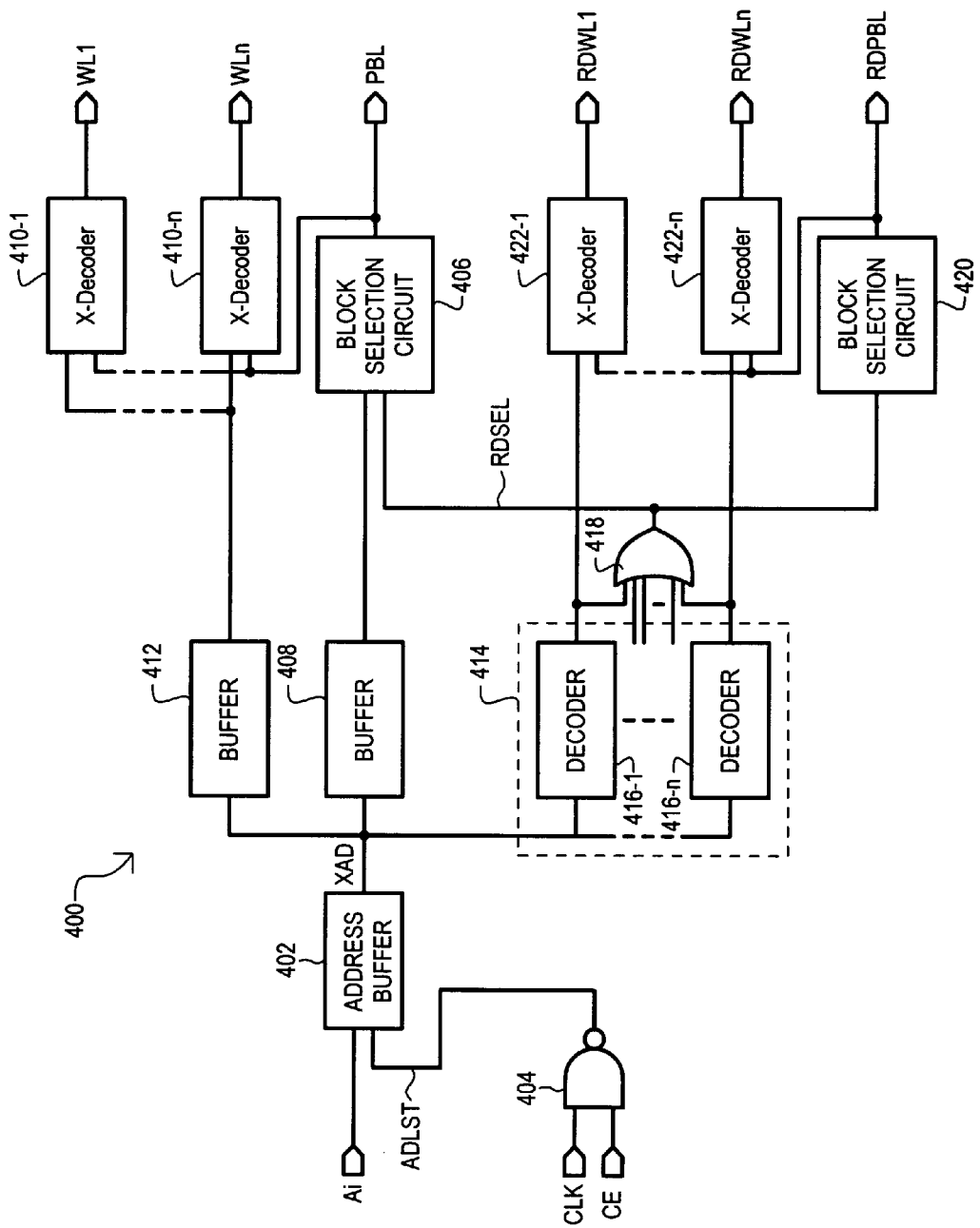
FIG. 4 is a block diagram showing the structure of a conventional selection circuit.

In the redundant access illustrated by FIG. 3, address XAD corresponds to the address of a redundant memory cell array. The one-shot PBLST signal is applied to second circuit 122. In addition, an active RDSEL signal, generated by the operation of redundant cell decoder 110, is applied to second circuit 122. The RDSEL signal of the particular example of FIG. 3 is active when high. Accordingly, waveform RDSEL in FIG. 3 is shown to include a low-to-high transition. In the redundant access case, the second circuit 122 supplies the logical sum between the one-shot signal PBLST and the RDSEL signal to the redundant block selection circuit 118. This results in the redundant block selection circuit 118 outputting a low RDPBL signal. Referring now to FIG. 5, in the event the precharge circuit of FIG. 5 is utilized for redundant memory cells, the low RDPBL signal, generated in accordance with the one-shot signal PBLST, will result in the disconnection of bit lines BL1 and BL2 from /BL1 and /BL2, respectively. This operation is represented by the RDPBL waveform set forth in FIG. 3.

The example of FIG. 3 continues with one redundant X-decoder (126-1 to 126-n) outputting an activation signal to a redundant word line (RDWL1 to RDWLn) in response to signals output from redundant cell decoder 110 and the RDPBL signal. As will be recalled, the RDPBL signal was generated in response to the PBLST signal pulse. The activation signal from the selected X-decoder (126-1 to 126-n) results in a redundant word line (RDWL1 to RDWLn) being driven high, and access to a redundant memory cell being established. This is illustrated in FIG. 3 by the RDWL waveform transitioning high. Thereafter, the drive signals associated with redundant memory cells are activated. Referring to FIG. 5, if the illustrated precharge circuit represents a precharge circuit for redundant memory cells, the SAP signal is driven to a high level and the SAN signal is driven to a low logic level. This is illustrated in FIG. 3, by the SAN, SAP (Redundant) waveform. The active drive signals (SAN and SAP) activate sense amplifiers (like SA1 and SA2 in the case of FIG. 5). Consequently bit line pairs are driven to complementary values. This is illustrated by waveform BL, /BL (Redundant) of FIG. 3. In this way, redundant memory cells can be accessed for a data read operation or the like.

An access according to FIG. 3 further includes the address XAD, that is output from address buffer 102, being supplied to normal block selection circuit 116, via buffer 108. Such an application of the address XAD results in the normal block selection circuit 116 outputting a low precharge stop signal PBL, which can be output to a normal memory cell array. This is illustrated by the high-to-low transition in the PBL waveform of FIG. 3. However, because the operation of the redundancy cell decoder 110 results in an active RDSEL signal, the active RDSEL signal inhibits the operation of the normal block selection circuit 116. As a result, the PBL signal is returned high. This is represented by the low-to-high transition in the PBL waveform of FIG. 3.

Furthermore, in a redundant access, a normal word line (WL1 to WLn) can be temporarily activated. However, such an activated normal word line is deactivated by the RDSEL signal generated in response to the redundant cell decoder 110, and so does not adversely influence a normal memory cell. Also in a redundant access case, drive signals for normal memory cell sense amplifiers remain inactive. This results in only weak signal being placed on the bit lines during a temporary normal word line activation. The weak signal further does not adversely influence a normal memory cell. Such sense amplifier drive signals are represented by the SAN, SAP (Normal) waveform of FIG. 3.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a normal cell array that is selected to access normal cells;
   a redundant cell array that is selected to access redundant cells; and
   a select circuit that temporarily selects the redundant cell array without waiting for a determination as to whether the redundant cell array is selected or deselected when access to a normal cell is replaced by access to a redundant cell.

2. The semiconductor memory device of claim 1, wherein:
   the select circuit selects the redundant cell array in response to a timing signal, and further selects and deselects the redundant cell array in response to a decode signal.

3. The semiconductor memory device of claim 2, further including:
   a redundant decoder that generates the decode signal in response to address information.

4. The semiconductor memory device of claim 2, further including:
   a logic circuit that generates the timing signal in response to a clock signal.

5. A semiconductor memory device having a cell array that includes a normal cell array and a redundant cell array, the semiconductor memory device, comprising:
   a first selection circuit that selects the normal cell array;
   a second selection circuit that outputs a precharge stop signal and selects the redundant cell array in response to a selection input signal;
   a signal output circuit that outputs the selection input signal to the second selection circuit when the cell array is selected.

6. The semiconductor memory device of claim 5, further including:
   the second selection circuit further de-selects the redundant cell array in response to a de-selection indication;
   a decoder circuit that determines if the redundant cell array is to be selected or de-selected, the decoder circuit generating the de-selection indication if the redundant cell array is to be de-selected.

7. The semiconductor memory device of claim 6, wherein:
   the decoder circuit includes a plurality of redundant decoders, each redundant decoder receiving address information and generating a decode output signal when the received address information corresponds to predetermined address information.

8. The semiconductor memory device of claim 7, further including:
   the second selection circuit further selects the redundant cell array in response to a redundant selection indication; and
   the decoder further generates the redundant selection indication if the redundant cell array is to be selected.

9. The semiconductor memory device of claim 8, further including:
   a logic circuit that generates the redundant selection indication in response to the logical sum of the decode output signals.

10. The semiconductor memory device of claim 5, further including:
    the first selection circuit further de-selects the normal cell array in response to a normal de-selection indication; and
    a decoder circuit that determines if the redundant cell array is to be selected or de-selected, the decoder circuit generating the normal de-selection indication if the redundant cell array is to be selected.

11. The semiconductor memory device of claim 5 further including:
    an input logic gate that generates a timing signal in response to a clock signal; and
    the signal output circuit outputs the selection input signal in response to the timing signal.

12. The semiconductor memory device of claim 11, wherein:
    the timing signal is a one-shot pulse generated in response to predetermined transitions in the clock signal.

13. The semiconductor memory device of claim 5, further including:
    a plurality of redundant decoders that activate at least one redundant word line in response to the precharge stop signal.

14. A semiconductor memory device, comprising:
    a timing circuit that generates a timing signal when the semiconductor memory device is accessed;
    a redundant decoder that provides a redundant decode indication or a non-redundant decode indication in response to address information;
    a redundant selection circuit that activates a redundant selection signal in response to the timing signal or the redundant decode indication; and
    a normal selection circuit that generates a normal selection signal in response to address information, and a normal de-selection signal in response to the redundant decode indication.

15. The semiconductor memory device of claim 14, wherein:
    the redundant selection circuit further de-activates the redundant selection signal in response to the non-redundant decode indication.

16. The semiconductor memory device of claim 14, wherein:
    the timing circuit includes a logic circuit for generating the timing signal in response to a clock signal.

17. The semiconductor memory device of claim 16, wherein:
    the timing circuit further includes a first circuit that generates a one-shot timing signal in response to transitions in the clock signal.

18. The semiconductor memory device of claim 14, wherein:
    the timing circuit further includes a second circuit that receives redundant decode indications and non-redundant decode indications from the redundant decoder and outputs a selection timing signal to the redundant selection circuit; and
    the redundant selection circuit activates a redundant selection signal in response to the selection timing signal.

19. The semiconductor memory device of claim 14, further including:
    a plurality of bit line pairs;
    a plurality of precharge devices that connect bit line pairs to one another when activated and disconnect bit line pairs from one another when de-activated; and
    the redundant selection signal de-activates predetermined precharge devices.

20. The semiconductor memory device of claim 14, further including:

a plurality of bit line pairs;

a plurality of precharge devices that connect bit line pairs to one another when activated and disconnect bit line pairs from one another when de-activated; and the normal selection signal de-activates predetermined precharge devices.

* * * * *